United States Patent
Rivoir

(10) Patent No.: US 7,333,042 B2
(45) Date of Patent: Feb. 19, 2008

(54) METHOD AND SYSTEM FOR DIGITAL TO ANALOG CONVERSION USING MULTI-PURPOSE CURRENT SUMMATION

(75) Inventor: Jochen Rivoir, Magstadt (DE)

(73) Assignee: Verigy (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 11/489,190

(22) Filed: Jul. 19, 2006

(65) Prior Publication Data

US 2007/0024481 A1 Feb. 1, 2007

(30) Foreign Application Priority Data

Jul. 27, 2005 (EP) .................................. 05106922

(51) Int. Cl.
*H03M 1/44* (2006.01)
(52) U.S. Cl. ....................................... 341/144
(58) Field of Classification Search ................ 341/144, 341/118, 120, 153
See application file for complete search history.

(56) References Cited

U.S. PATENT DOCUMENTS 5,754,665 A * 5/1998 Hosoi ......................... 381/94.1
6,727,832 B1 * 4/2004 Melanson .................... 341/143
7,123,661 B2 * 10/2006 Straeussnigg ............... 375/260
2004/0239543 A1 12/2004 Clara et al.
2005/0040979 A1 2/2005 Brooks et al.

OTHER PUBLICATIONS

European Search Report Dated Jan. 27, 2006.

\* cited by examiner

*Primary Examiner*—Brian Young

(57) ABSTRACT

A method and a corresponding system for converting a digital signal to an analog signal using a plurality of signal sources, preferably current sources, at least two of the signal sources being equal output signal magnitude sources, said method including controlling the equal output signal magnitude sources by a logic circuit, providing a digital input signal to the logic circuit, the digital input signal being derived from the digital signal to be converted, filtering the digital input signal using a filter, the filter having a filter order being adaptable by the logic unit in response to needs concerning bandwidth of the conversion, and summing the outputs of the equal output signal magnitude sources to contribute to the analog signal.

16 Claims, 6 Drawing Sheets

Fig. 3

| Sel | Number codes | Filter order | Description |
|---|---|---|---|
| 0 | 256 | 1 | 8 bit HW delta-sigma converter, no filter |
| 0 | 129 | 2 | 7+ bit HW delta-sigma converter, 2nd order filter |
| 0 | 65 | 4 | 6+ bit HW delta-sigma converter, 4th order filter |
| 0 | 33 | 8 | 5+ bit HW delta-sigma converter, 8th order filter |
| 0 | 17 | 16 | 4+ bit HW delta-sigma converter, 16th order filter |
| 0 | 9 | 32 | 3+ bit HW delta-sigma converter, 32th order filter |
| 0 | 5 | 64 | 2+ bit HW delta-sigma converter, 64th order filter |
| 0 | 3 | 128 | 1,5 bit HW delta-sigma converter, 128th order filter |
| 0 | 2 | 256 | Single bit HW delta-sigma converter, 256th order filter |
| 1 | 256 | 1 | 8+ bit SW delta-sigma converter or 8 bit Nyquist converter with DEM, no filter |
| 1 | 129 | 2 | 7+ bit SW delta-sigma converter or 7+ bit Nyquist converter with DEM, 2nd order filter |
| 1 | 65 | 4 | 6+ bit SW delta-sigma converter or 6+ bit Nyquist converter with DEM, 4th order filter |
| 1 | 33 | 8 | 5+ bit SW delta-sigma converter or 5+ bit Nyquist converter with DEM, 8th order filter |
| 1 | 17 | 16 | 4+ bit SW delta-sigma converter, 16th order filter |
| 1 | 9 | 32 | 3+ bit SW delta-sigma converter, 32th order filter |
| 1 | 5 | 64 | 2+ bit SW delta-sigma converter, 64th order filter |
| 1 | 3 | 128 | 1,5 bit SW delta-sigma converter, 128th order filter |
| 1 | 2 | 256 | Single bit SW delta-sigma converter, 256th order filter |

Fig. 7

| Sel | Number codes | Filter order | Description |
|---|---|---|---|
| 0 | 65 | 1 | 6+ bit HW delta-sigma converter, no filter |
| 0 | 33 | 2 | 5+ bit HW delta-sigma converter, 2nd order filter |
| 0 | 17 | 4 | 4+ bit HW delta-sigma converter, 4th order filter |
| 0 | 9 | 8 | 3+ bit HW delta-sigma converter, 8th order filter |
| 0 | 5 | 16 | 2+ bit HW delta-sigma converter, 16th order filter |
| 0 | 3 | 32 | 1,5+ bit HW delta-sigma converter, 32th order filter |
| 0 | 2 | 64 | Single bit HW delta-sigma converter, 64th order filter |
| 1 | 65 | 1 | 6+ bit SW delta-sigma converter, no filter |
| 1 | 33 | 2 | 5+ bit SW delta-sigma converter, 2nd order filter |
| 1 | 17 | 4 | 4+ bit SW delta-sigma converter, 4th order filter |
| 1 | 9 | 8 | 3+ bit SW delta-sigma converter, 8th order filter |
| 1 | 5 | 16 | 2+ bit SW delta-sigma converter, 16th order filter |
| 1 | 3 | 32 | 1,5 bit SW delta-sigma converter, 32th order filter |
| 1 | 2 | 64 | Single bit SW delta-sigma converter, 64th order filter |
| 2 | 65 | 1 | 9~16 bit Nyquist converter, no filter |

METHOD AND SYSTEM FOR DIGITAL TO ANALOG CONVERSION USING MULTI-PURPOSE CURRENT SUMMATION

BACKGROUND

The present invention relates to a method and a corresponding system for converting a digital signal to an analog signal.

Digital to analog conversion is widely applied in electronic signal processing. Known conversion techniques use so-called current steering Nyquist digital to analog converters (DAC) summing binary weighted current sources to form the analog signal. Such Nyquist DACs offer high-speed conversion with relatively few current sources. The output analog signal shows inaccuracy due to mismatch of the weighted current sources, in particular with large current range. Furthermore a hardware filter is necessary, e.g. a low pass filter, for filtering the output signal to suppress harmonic content in the output signal.

Another known conversion technique uses a so-called multi-bit Delta-Sigma converter summing only equal current sources and thus offering high accuracy at reduced conversion speed. A subset of n out of in total N current sources can be selected using a dynamic element matching (DEM) unit to further improve accuracy by averaging out mismatch errors of the individual equal current sources. A hardware filter is still necessary for filtering the output signal.

SUMMARY OF THE DISCLOSED EMBODIMENTS

It is an object of the invention to provide an improved method and system for digital to analog conversion. The object is solved by the independent claims. Further embodiments are defined by the dependent claims.

According to embodiments of the present invention, equal output signal magnitude sources, e.g. equal current sources or equal voltage sources, are used for a multi-bit delta-sigma modulation. Subsequent filtering can be performed using a finite impulse response (FIR) filter, wherein the FIR chain is broken and the inputs of the FIR are enumerated. An optimization of resolution, accuracy, bandwidth and speed is achieved by adapting the inventive conversion on a per signal basis, i.e. on the base of an analysis of the signal to be converted and/or requirements of the signal to be generated. The digital content is maximized to allow process portability and/or performance scalability.

Thus, embodiments of the invention comprises adapting said conversion on a per signal basis, in response to needs concerning bandwidth and accuracy of said conversion for achieving the best tradeoff between sample rate and resolution of said conversion.

In a further embodiment a so-called segmented DAC is used as an over-sampling converter by using the binary weighted signal sources only. The segmented DAC comprises L binary weighted output signal magnitude sources for the L least significant bits of the signal to be converted. Furthermore the segmented DAC comprises $2^M$ equal output signal magnitude sources for the most significant bits of the signal to be converted. The outputs of the weighted output signal magnitude sources and the equal output signal magnitude sources are summed to form the analog signal.

Embodiments of the invention can be partly or entirely embodied or supported by one or more suitable software programs, which can be stored on or otherwise provided by any kind of data carrier, and which might be executed in or by any suitable data processing unit. Software programs or routines are preferably applied to control a flexible dynamic selection logic to select a subset of signal sources to enable software programmable tradeoff between resolution, bandwidth and filter effectiveness.

BRIEF DESCRIPTION OF DRAWINGS

Other objects and many of the attendant advantages of embodiments of the present invention will be readily appreciated and become better understood by reference to the following more detailed description of embodiments in connection with the accompanied drawing(s). Features that are substantially or functionally equal or similar will be referred to by the same reference sign(s).

FIG. 3 shows the interdependence of number (of) codes, filter order and the resulting resolution and filter order, FIG. 7 shows the interdependence of number codes, filter order and the resulting resolution and filter order for the second embodiment of FIG. 6.

DETAILED DESCRIPTION OF THE DISCLOSED EMBODIMENTS

Figure 1:
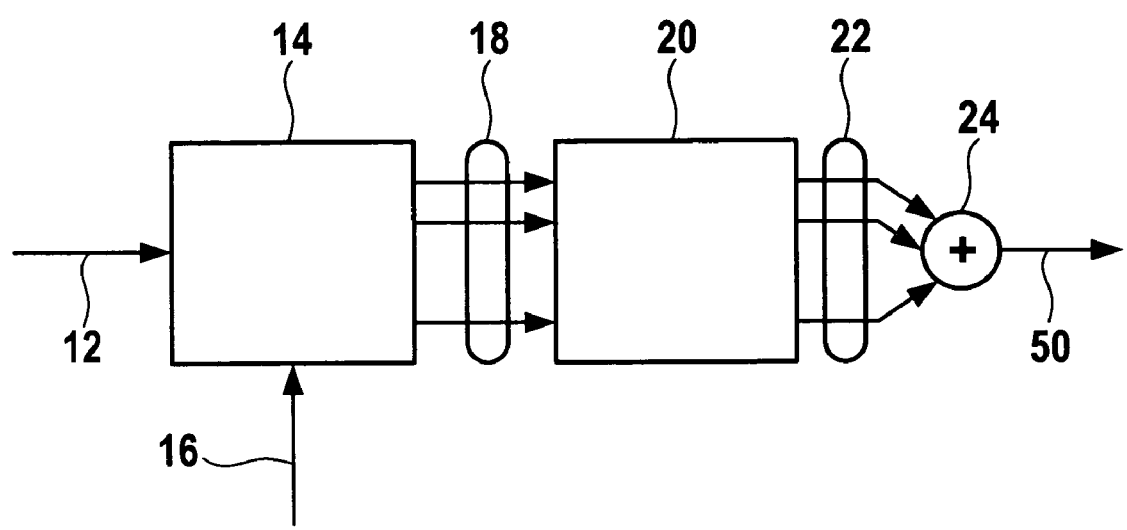
FIG. 1 shows a block diagram representing the general idea of the invention.

FIG. 1 shows a block diagram representing the general idea of the invention. A data stream 12 being derived from a digital signal to be converted is fed to a flexible dynamic selection unit 14 comprising a logic unit described in more details below. The flexible dynamic selection unit 14 being controlled by settings 16 being static during a conversion cycle, said static settings being adapted to said data stream and/or said tradeoff between accuracy and bandwidth. The flexible dynamic selection unit 14 provides N output signals 18 to control N signal sources 20, e.g. N current sources. The output of the N signal sources 20 are summed to form said analog signal 50 at the output of adder 24.

The flexible dynamic selection unit 14 selects a subset of signal sources 20 to enable software programmable tradeoff between resolution, bandwidth and filter effectiveness. The settings 16 are preferably software programmable. The data stream 12 can be the digital signal to be converted or a signal derived out of the digital signal to be converted. In a further embodiment the data stream is read out from a memory unit (not shown), thus the data stream is available from a signal pre-processing and has not to be provided in real-time.

Within the flexible dynamic selection unit 14 the data stream may be split feeding two different signal paths providing different data processing. In a first path the data stream is over-sampled whereas in the second path the data stream remains substantially unchanged. By a software controlled selection, and thus programmable, the output signal of either the first path or of the second path, or of a combination of first and second path output signal, is forwarded to a logic unit controlling said N signal sources 20.

Figure 2:
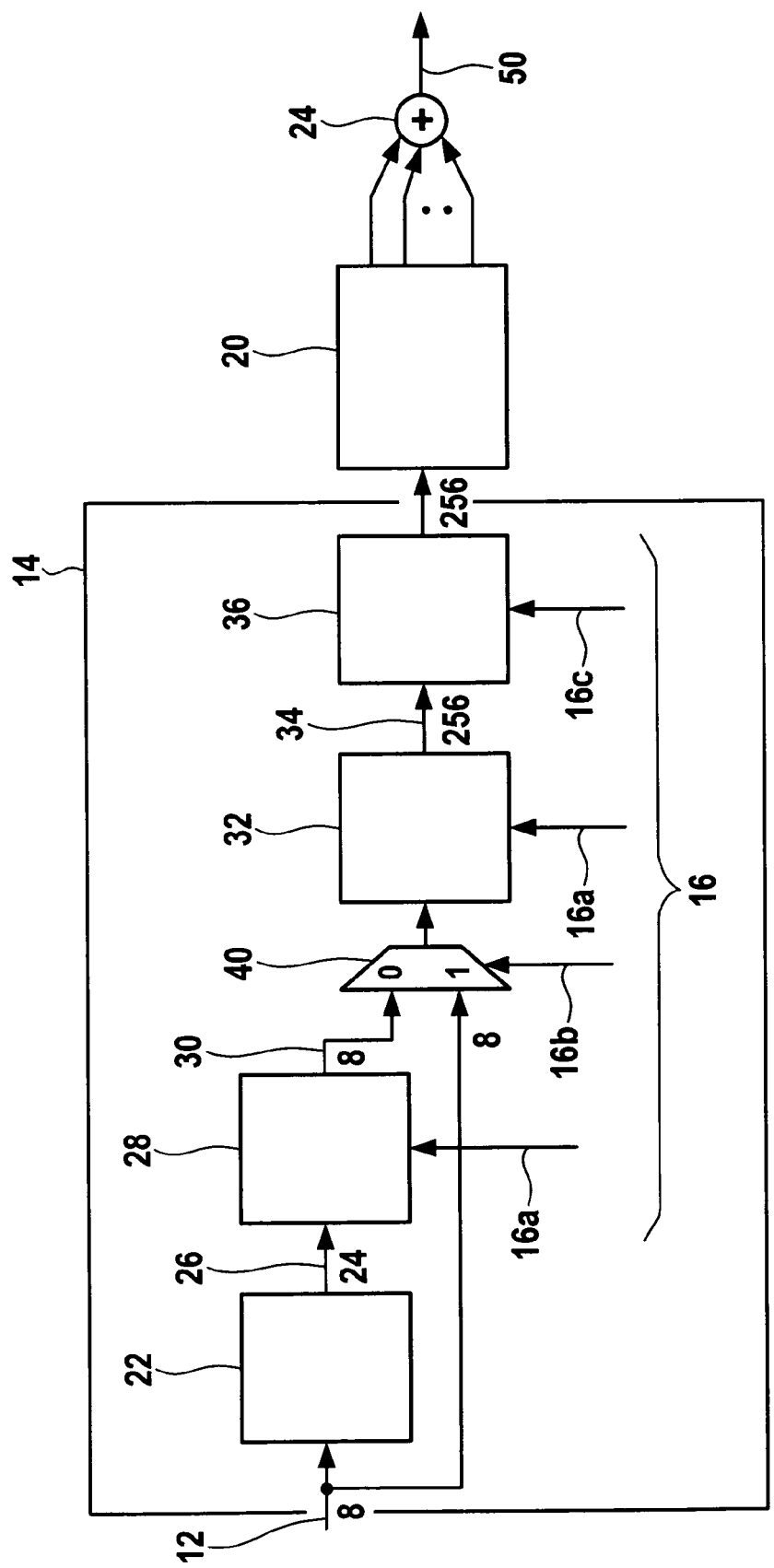
FIG. 2 shows a first embodiment of the invention.

FIG. 2 shows a first embodiment of the invention. The data stream 12 is formed by an 8-bit wide digital signal. Preferably the data stream 12 is oversampled. The flexible dynamic selection unit 14 comprises at its input two paths, both processing the data stream 12 to a selection unit 40 controlled by settings 16.

A first path comprises a demultiplexer 22 for demultiplexing the 8-bit wide data stream 12 into a 24-bit wide signal 26 fed into a delta-sigma modulator 28. Three 8-bit wide words at the input of demultiplexer 22 are combined to form one 24-bit wide word at the output of demultiplexer 22. The delta-sigma modulator 28 is controlled by settings 16, i.e. by a control signal 16a concerning the number codes (number of codes) determining the resolution at the output of delta-sigma modulator 28. E.g. for number codes of 256 at the output of delta-sigma modulator provides an 8-bit wide output signal 30. The delta-sigma modulator 28, although shown to have a 8-bit wide output signal 30 corresponding to 256 different discrete output values, is able to generate output values intermediate between two discrete consecutive output values. This is preferably achieved by using an over-sampled data stream 12 and by averaging between two discrete consecutive values for a part of the time available due to over-sampling. E.g. for a 30-fold over-sampling the delta-sigma modulator for the case shown in FIG. 2 may average for 10 conversion clocks before delivering a valid converted output signal 30.

A second path directly routes the data stream 12 to the selection unit 40. According to a selection unit 40 control signal 16b either one of first and second paths is selected and connected to a thermometer code encoding unit 32. The thermometer code encoding unit 32 provides an output signal having a number of levels being selected by the control signal 16a concerning the number codes.

The output signal 34 of the thermometer code encoding unit 32 is fed to a finite impulse response (FIR) filter unit 36 being controlled by control signal 16c as part of settings 16. The control signal 16c sets the filter order of FIR filter unit 36. The FIR filter unit 36 comprises the logic unit controlling a number of equal output signal magnitude sources 20, e.g. N equal current sources.

The thermometer code encoding unit 32 further comprises a dynamic element matching unit for enhancing accuracy by compensating mismatch errors within said equal output signal magnitude sources 20 by cyclical rotation of activation of all physical current sources and thus guaranteeing balanced loading of all physical current sources.

The control signal 16a concerning number codes, the control signal 16c concerning filter order, and the number of N equal current sources 20 are related to each other, i.e. the number codes corresponds to the quotient of the number of N equal current sources 20 and the filter order.

FIG. 3 shows the interdependence of number codes, filter order and the resulting resolution and filter order for the example of N=256 equal current sources 20.

In the upper part of FIG. 3 the interdependence is shown for the control signal 16b being "0", thus the selection unit 40 connects the first path to the thermometer code encoding unit 32. For number codes being 256 the first path realizes an 8 bit hardware delta-sigma conversion with a filter order being "1", i.e. no filter function. This results in high accuracy but low bandwidth and correspondingly low speed. Decreasing number codes correspond to an increase of the filter order, thus reducing accuracy and increasing bandwidth. E.g. for the given N=256=$2^8$ equal current sources a number codes of 9 being $2^3+1$ the filter order is 32 being $2^5$.

In the lower part of FIG. 3 the interdependence is shown for the control signal 16b being "1", thus the selection unit 40 connects the second path to the thermometer code encoding unit 32, thus no hardware delta-sigma modulation is present like in the first path. Instead, either a software delta-sigma conversion or a Nyquist conversion with dynamic element matching can be realized. Again a filter function is realized and the filter order can be selected by appropriate selection of number codes and filter order for a given number N of equal current sources 20. E.g. for number codes of 129 the second path realizes a 7 bit software delta-sigma conversion or a 7 bit Nyquist converter with dynamic element matching, both with a filter order being "2". This results in high accuracy but low bandwidth and correspondingly low speed. Again, decreasing number codes correspond to an increase of the filter order, thus reducing accuracy and increasing bandwidth. E.g. for the given N=256=$2^8$ equal current sources a number codes of 2 being $2^0+1$ the filter order is 256 being $2^8$. For realizing the software delta-sigma modulator, the data stream 12 is preferably pre-processed (not shown).

Figure 4:
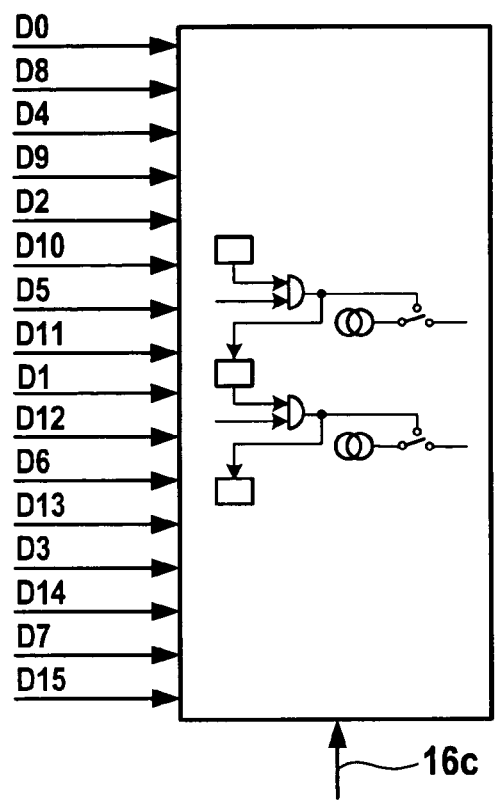
FIG. 4 shows an implementation of finite impulse response and equal current sources.

FIG. 4 shows an implementation of finite impulse response 36 and equal current sources 20, preferably as an integrated circuit. The embodiment shown comprises in total 16 equal current sources, thus allowing filter orders of 1, 2, 4, 8 or 16. Accordingly all 16 input (for filter order of 1) or only 8, 4, 2 inputs are used, or only one input is used, controlled by control signal 16c. The filter order can be programmed by breaking a chain of 16 delay elements, each of which being able to control one of said equal current sources.

Figure 5:
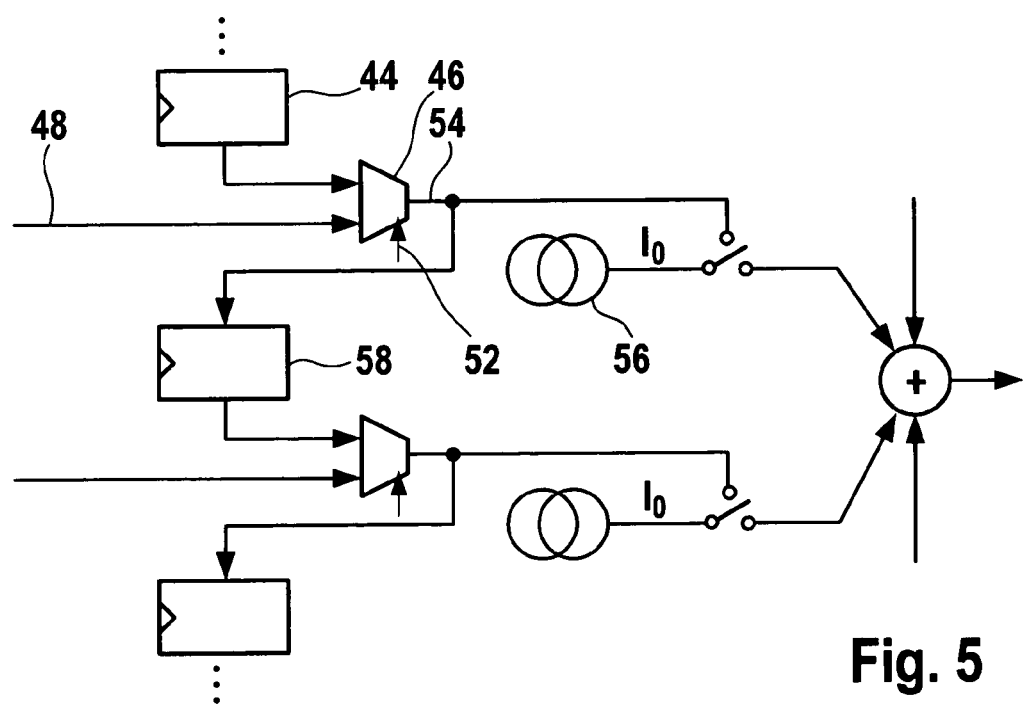
FIG. 5 shows part of the implementation of FIG. 4 in greater details.

FIG. 5 shows part of the implementation of FIG. 4 in greater details. The output of first delay element 44 is fed to an input of switch element 46 having a further external input 48. According to a control signal 52 either the output of first delay element 44 or the external input 48 is connected to the output 54 of first delay element 44. The output 54 is used as a control signal for the current source 56, being one of said in total 16 equal current sources 20 of the implementation shown in FIG. 4. Furthermore, the output 54 is inputted to a second delay element 58. This structure is repeated in total 16 times.

For a maximum filter order of 16, all control signals 52 are such that the output of preceding delay element 44 is connected to the input of the succeeding delay element 58, thus forming a chain of in total 16 delay elements 44, 58. Thus a finite impulse response filter with filter order 16 is formed by the 16 current sources and the corresponding 16 delay elements 44, 58 connected as described above. The filter order can be varied by the control signals 52 which are determined by the control signal 16c concerning filter order. In the shown embodiment, e.g. the chain of 15 delay elements 44, 58 can be broken into 2 sub chains of 7 delay elements each, 4 sub chains of 3 delay elements each, 8 sub chains of 1 delay element each, or 16 sub chains with no delay element.

The inputs 48 of switch elements 46 are enumerated according to a scheme which is shown in FIG. 4 for the case of 16 current sources 56. According to the selected filter order only part of the inputs may be used. E.g. in case of a filter order of 16 only the first input D0 is used. In case of a filter order of 8 the inputs D0 and D1 are used. As a rule, for a selected filter order of K, an used input is followed by K−1 unused inputs.

With N equal current sources 56 the transfer function of the finite impulse response filter becomes a so-called boxcar averaging filter providing a running average according to the following equation:

$$F(z)=I_0(1+z^{-1}+\ldots+z^{-(N-1)}+z^{-N})$$

Figure 6:
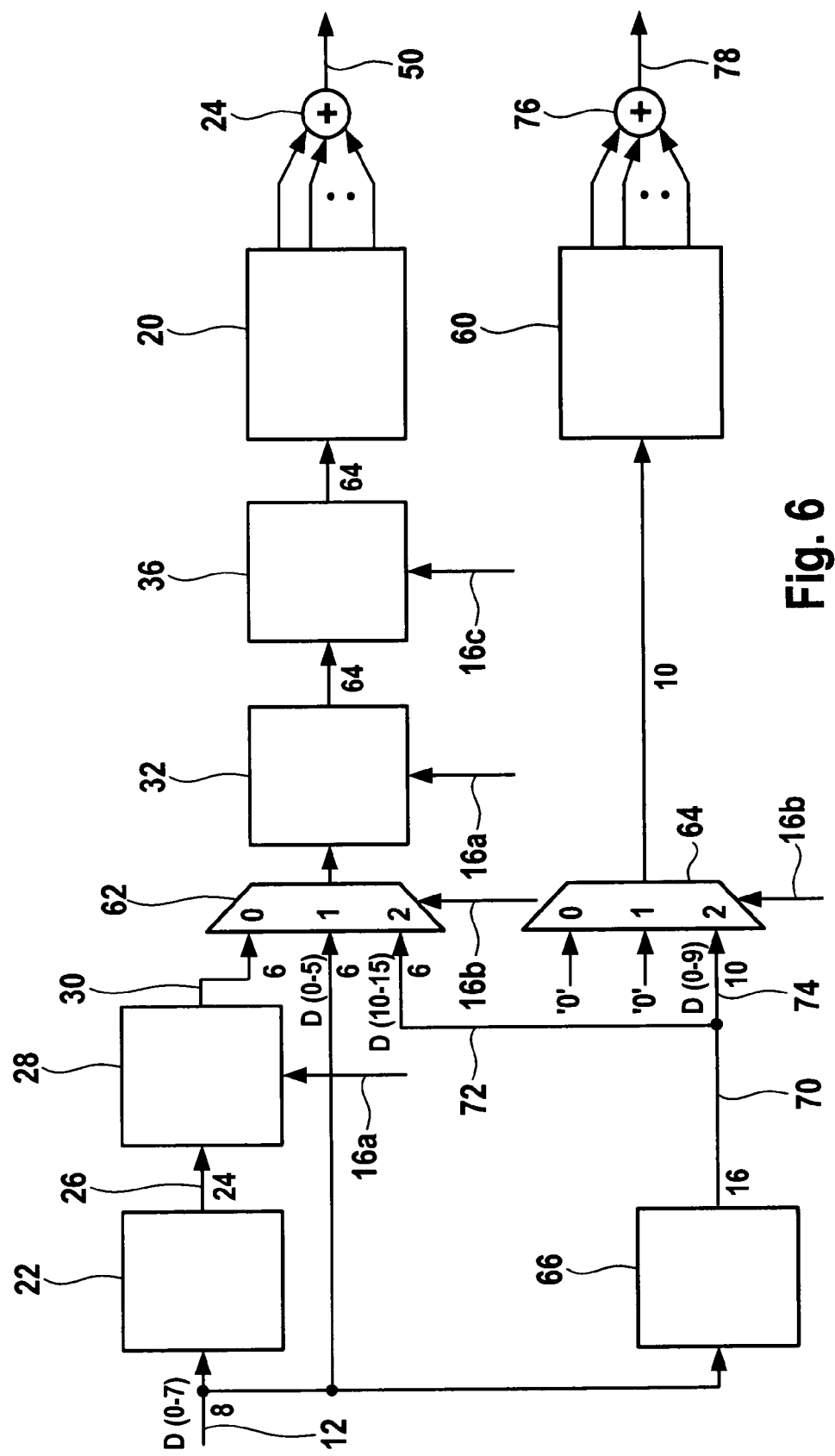
FIG. 6 shows a second embodiment of the present invention.

FIG. 6 shows a second embodiment of the present invention. The upper part shown in FIG. 6 is very similar to the embodiment shown in FIG. 2. As a first difference the selections unit 62 has three inputs, namely beside the output 30 of delta-sigma converter 28 and the direct connection to data stream 12 a third input provided by the output 70 of a second demultiplexer 66. Only the most significant bits 72 of the output 70 are fed to the third input of the selection unit 62, whereas the least significant bits 74 are fed to a second selection unit 64, i.e. to a third input of the second selection unit 64. Both selection units 62, 64 are controlled by the same control signal 16b. The first and second inputs of second selection unit 64 are tied to Zero.

The output of second selection unit 64 is fed to a unit 60 comprising a number of binary weighted output signal magnitude sources, e.g. binary weighted current sources. The outputs of said binary weighted current sources are summed at adder 76 resulting in a further analog signal component 78. Finally the output signals 50, 78 of adders 24, 76 are summed by a further adder (not shown) to result in the final analog signal corresponding to the digital signal to be converted.

The embodiment shown in FIG. 6 comprises in total 64 equal current sources 20 and in total 10 binary weighted current sources 60. The data stream 12 is an 8-bit wide digital signal. The demultiplexer 22 demultiplexes the 8-bit wide data stream 12 into a 24-bit wide signal 26 fed into a delta-sigma modulator 28. According to the total number of $64=2^6$ equal current sources, the delta-sigma modulator 28 outputs a 6-bit wide signal to the first input of the first selection unit 62.

FIG. 7 shows the interdependence of number codes, filter order and the resulting resolution and filter order for the example of N=64 equal current sources 20 and 10 binary weighted current sources 60. In the upper part of FIG. 7 the interdependence is shown for the control signal 16b being "0", thus the selection unit 62 connects the first path to the thermometer code encoding unit 32. For number codes being 65 the first path realizes a 6 bit hardware delta-sigma conversion with a filter order being "1", i.e. no filter function. This results in high accuracy but low bandwidth and correspondingly low speed. Decreasing number codes correspond to an increase of the filter order, thus reducing accuracy and increasing bandwidth. E.g. for the given $N=64=2^6$ equal current sources a number codes of 9 being $2^3+1$ the filter order is 8 being $2^3$.

In the further down part of FIG. 7 the interdependence is shown for the control signal 16b being "1", thus the selection unit 62 connects the second path to the thermometer code encoding unit 32, thus no hardware delta-sigma modulation is present like in the first path. Instead a software delta-sigma conversion can be realized. Again a filter function is realized and the filter order can be selected by appropriate selection of number codes and filter order for a given number N of equal current sources 20. E.g. for number codes of 33 the second path realizes a 5 bit software delta-sigma conversion with a filter order being "2". This results in high accuracy but low bandwidth and correspondingly low speed. Again, decreasing number codes correspond to an increase of the filter order, thus reducing accuracy and increasing bandwidth. E.g. for the given $N=64=2^6$ equal current sources a number codes of 2 being $2^0+1$ the filter order is 64 being $2^6$. For realizing the software delta-sigma modulator, the data stream 12 is preferably pre-processed (not shown).

In the lower part of FIG. 7 the interdependence is shown for the control signal 16b being "2", thus the selection unit 62 connects the most significant bits 72 to the thermometer code encoding unit 32, and the second selection unit 64 connects the least significant bits 74 to the binary weighted current sources 60. This configuration allows for the realization of a 9 to 16 bit Nyquist converter with no filter function.

What is claimed is:

1. A method for converting a digital signal to an analog signal, said method using a plurality of signal sources, at least two signal sources having equal output signal magnitudes, said method comprising:
   determining a digital input signal on the basis of said digital signal to be converted and providing this digital input signal to a logic circuit controlling said signal sources by individual control signals,
   controlling said signals sources by said individual control signals,
   filtering said digital input signal using a filter, said filter including said logic unit and said signals sources, said filter having a filter order being adaptable by said logic unit for forming said analog signal, and
   summing the outputs of said signal sources to contribute to said analog signal,
   wherein the number of signal sources is selectable depending from the filter order of the filter, wherein the filter order and the number of signal sources are selected in order to effect a tradeoff between bandwidth and accuracy of said conversion.

2. The method of claim 1, wherein said logic circuit comprises a plurality of delay elements, and adaptation comprises establishing at least one chain of said delay elements, wherein the length of said chain corresponds to said filter order.

3. The method of claim 2, wherein several sub-chains of preferably equal length are established for adaptation of said filter order.

4. The method of claim 3, wherein the number of sub-chains corresponds to the word-width of said digital input signal provided to said logic circuit.

5. The method of claim 1, further comprising providing said digital input signal to said logic circuit by a thermometer code encoding circuit, said thermometer code encoding circuit providing an output signal having a number of levels being selectable and being corresponding to the quotient of the number of signal sources and said filter order.

6. The method of claim 5, wherein said thermometer code encoding circuit comprises a dynamic element matching circuit for enhancing accuracy by compensating mismatch errors within said sources.

7. The method of claim 5, wherein in a first selectable operation mode an input signal to said thermometer code encoding circuit is provided by a delta-sigma modulator, wherein the word-width of said input signal corresponds to said number of levels of said output signal of said thermometer code encoding circuit.

8. The method of claim 7, wherein said delta-sigma modulator is driven by an over-sampled signal being provided in said first selectable operation mode by a flexible sampling software circuit.

9. The method of claim 7, wherein an input signal to said delta-sigma modulator is of wider word-width than an output signal of said delta-sigma modulator.

10. The method of claim 9, wherein said input signal to said delta-sigma modulator is provided by a demultiplexer circuit expanding an input data to said demultiplexer to said wider word-width of said input signal of said delta-sigma modulator.

11. The method of claim 5, wherein in a second selectable operation mode an input signal for said thermometer code encoding circuit is provided by an input data related to said digital signal to be converted.

12. The method of claim 1, wherein at least a part of said signal sources are weighted output signal magnitude sources.

13. The method of claim 12, wherein said weighted output signal magnitude sources are driven by least significant bits of an input data related to said digital signal to be converted.

14. The method of claim 1, wherein an integrated segmented DAC circuit is used, said integrated segmented DAC circuit comprising two main paths connecting different inputs of said circuit to said summing at its output, wherein a first main signal path comprises an over-sampling converter and said equal output signal magnitude sources and wherein a second main signal path comprises weighted output signal magnitude sources, said adaptation being realized by selecting said first signal path within said integrated segmented DAC circuit to get a slow and accurate conversion by summing only said signal sources at its output to contribute to said analog signal or by selecting a combination of both of said main signal paths to get a fast but less accurate conversion by summing the outputs of said signal magnitude and of said weighted output signal sources to contribute to said analog signal.

15. A software program or product, encoded on a computer readable medium, for executing the method of claim 1, when run on a data processing system.

16. A system for converting a digital signal to an analog signal, said system comprising:

a plurality of signal sources, at least two of said signal sources having equal output signal magnitudes, means for controlling said signal sources by a logic unit, means for providing a digital input signal to said logic unit, said digital input signal being derived from said digital signal to be converted, a filter for filtering said digital input signal, said filter including said logic circuit and said signal sources, said filter having a filter order being adaptable by said logic unit in response to needs concerning the bandwidth of said conversion, and means for summing the outputs of said signal sources to contribute to said analog signal, wherein the number of signal sources is selectable depending from the filter order of the filter, wherein the filter order and the number of signal sources are selected in order to effect a tradeoff between bandwidth and accuracy of said conversion.

* * * * *